United States Patent [19]

Chao

[11] 3,806,862

[45] Apr. 23, 1974

[54] AMPLIFIER FOR SONAR TRANSMITTER

[75] Inventor: Andrew C. M. Chao, Monterey Park, Calif.

[73] Assignee: The Bendix Corporation, North Hollywood, Calif.

[22] Filed: Nov. 15, 1971

[21] Appl. No.: 198,951

Related U.S. Application Data

[63] Continuation of Ser. No. 853,155, Aug. 26, 1969, abandoned.

[52] U.S. Cl. .................... 340/5 R, 307/237, 330/15, 330/29

[51] Int. Cl. ............................................ H04b 13/02

[58] Field of Search ........ 330/15, 29, 118; 340/3 A, 340/5 R; 307/237

[56] References Cited

UNITED STATES PATENTS

| | | | |
|---|---|---|---|
| 3,311,868 | 3/1967 | Cupp et al. | 340/3 A |
| 3,622,960 | 11/1971 | Barron et al. | 340/3 A |

FOREIGN PATENTS OR APPLICATIONS

| | | | |
|---|---|---|---|
| 1,178,897 | 10/1964 | Germany | 330/118 |

OTHER PUBLICATIONS

Postal, "Simplified Push-Pull Theory," Audio Engineering, June 1953, pp. 21–23.

"How to Design Economical High Voltage Circuits," Motorola Semiconductor Products, Inc., Publication March 1961.

*Primary Examiner*—Herman Karl Saalbach
*Assistant Examiner*—James B. Mullins
*Attorney, Agent, or Firm*—Robert C. Smith; William F. Thornton

[57] ABSTRACT

A power amplifier configuration is described which operates in a quasi-switching mode with a clipped sinusoidal output which produces efficiencies substantially higher than expected with linear Class B operation or square wave switching operation when used in a narrow band application. This is achieved through precise control of the duration of peak saturation to produce a maximum of the fundamental frequency component of the output power. The amplifier thus controlled is defined as operating in the forced saturation mode and may alternately produce either essentially constant power or constant voltage output with respect to load variations within its narrow operating frequency band. The amplifier also retains a capability as a linear amplifier at reduced power levels. Several amplifier embodiments are described, all of which utilize the above operating concepts.

6 Claims, 13 Drawing Figures

INVENTOR.
ANDREW C.M. CHAO

By Robert C. Smith
ATTORNEY

AMPLIFIER FOR SONAR TRANSMITTER

This is a continuation, of application Ser. No. 853,155, filed Aug. 26, 1969 and now abandoned.

BACKGROUND OF THE INVENTION

In the design of power amplifiers, unlike much electronic equipment, great premium is placed on operating efficiency both because of the loss of useful transmitted power and because of the difficulty of dealing with the heat generated in the transmitter. Where it is desired to preserve the waveform of the transmitted signal, the amplifier must normally be designed to operate in a linear mode where the practical efficiency would not appreciably exceed 60 percent. The designer of a sonar transmitter must face an additional problem in that the piezoelectric transducers forming the output devices for the main transmitter amplifier are subject to considerable variation in impedance. This problem is further aggravated because impedance changes are caused in individual transducers by pressure variations resulting from changes in water depth in which the transducers may be operating. Thus the loading of the transmitter amplifiers may be subject to considerable variation depending upon which transducer or group of transducers is connected as a load and depending upon the environmental conditions. The designer faced with this problem may find that, in order to avoid distortion, he must further restrict the output power relative to what it might be if he could rely on constant load impedance.

The output stages for transmitters used in a complete sonar system are typically designed to operate in the mode or region where the relationsip between output power and load impedance is essentially linear. One reason for this is that, in addition to echo-ranging, these transmitters are used for underwater telephony where the input waveform must be preserved. The result of this, however, is to reduce the actual efficiency of operation during echo-ranging. Because of this problem in efficiency, another technique which has been proposed is to operate the transmitter amplifier in the clipping or switching mode during echo ranging, thereby producing a "square wave" effect. This will give rise to higher efficiencies, but produces a substantial portion of the energy in the form of undesirable higher frequency components causing distortion and switching "spikes" which, in high power equipment, tend to be almost impossible to filter out. Also, although the theoretical efficiency would appear to be quite high, it is only transmission in or near the fundamental frequency which is useful since the sonar receiver is a relatively narrow band device which preferably will not respond to the harmonics.

Another practical problem is that where the switching mode is used, high speed switching devices are required, typically of the multiple diffused variety, which ordinarily have limited power capability and are inherently less reliable than the usual slower conventional silicon alloy power transistors.

SUMMARY OF THE INVENTION

The amplifier concept which has been devised to overcome the above disadvantages uses a controlled input drive to operate, in part, over a linear range for lower level outputs and for high power operation in a quasi-switching mode which has been designated as the "forced saturation" region. The "forced saturation" output characteristics are between those of the linear Class B and square wave switching modes. Its output waveform approaches that of a clipped sinusoid; that is, it is sinusoidal at low levels but limited at the peaks by the power supply through input overdrive. The amount of input overdrive, or the duration of peak saturation, is controlled to maximize the fundamental component of the output power, thus attaining a very high efficiency in the conversion between direct current power and acoustic ouput, while minimizing the amplifier dissipation and harmonic generation. Alternatively, it may be driven to operate in the linear mode.

OPERATING CONCEPTS

Figure 1:
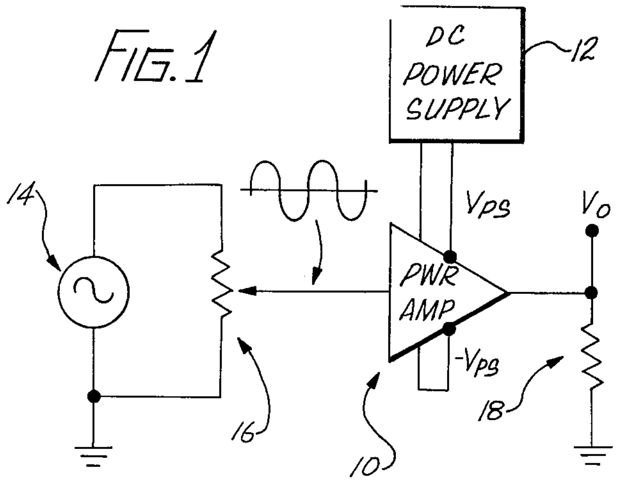
FIG. 1 is a schematic diagram of a basic push-pull amplifier arrangement which may be driven to operate in the forced saturation mode.

The forced saturation concept may be best illustrated by considering an organization such as that shown in FIG. 1 wherein a linear, push-pull transistor power amplifier 10, connected to a direct current power supply 12, is driven by means of an oscillator 14 having a sinusoidal output which is variable by means of the input potentiometer 16. The output of amplifier 10 is developed across a load device 18.

Figure 1A:
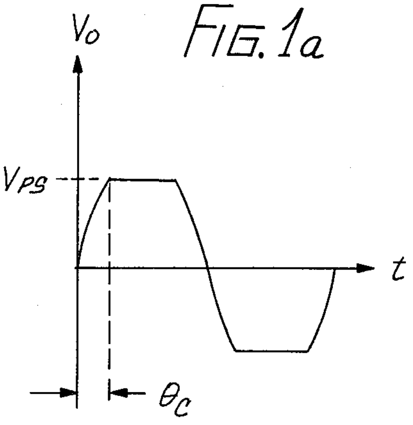
FIG. 1*a* is a graph showing typical operation in the forced saturation mode.

As the slider on potentiometer 16 is adjusted to increase the input to the amplifier, a point is reached where the amplifier produces a maximum unclipped Class B sinusoidal output which will reproduce the input waveform. If the input drive is then further increased, the ouput becomes limited by the power supply and appears as a clipped waveform such as that shown in FIG. 1a. The input waveform is sinusoidal, but the output waveform is more or less clipped depending upon the amount of overdrive. This amount or degree of overdrive is portrayed in FIG. 1*a* by the angle of the input wave $\theta_c$ at which the power supply begins to clip or limit the output. This will be referred to as the clipping angle.

Figure 2:
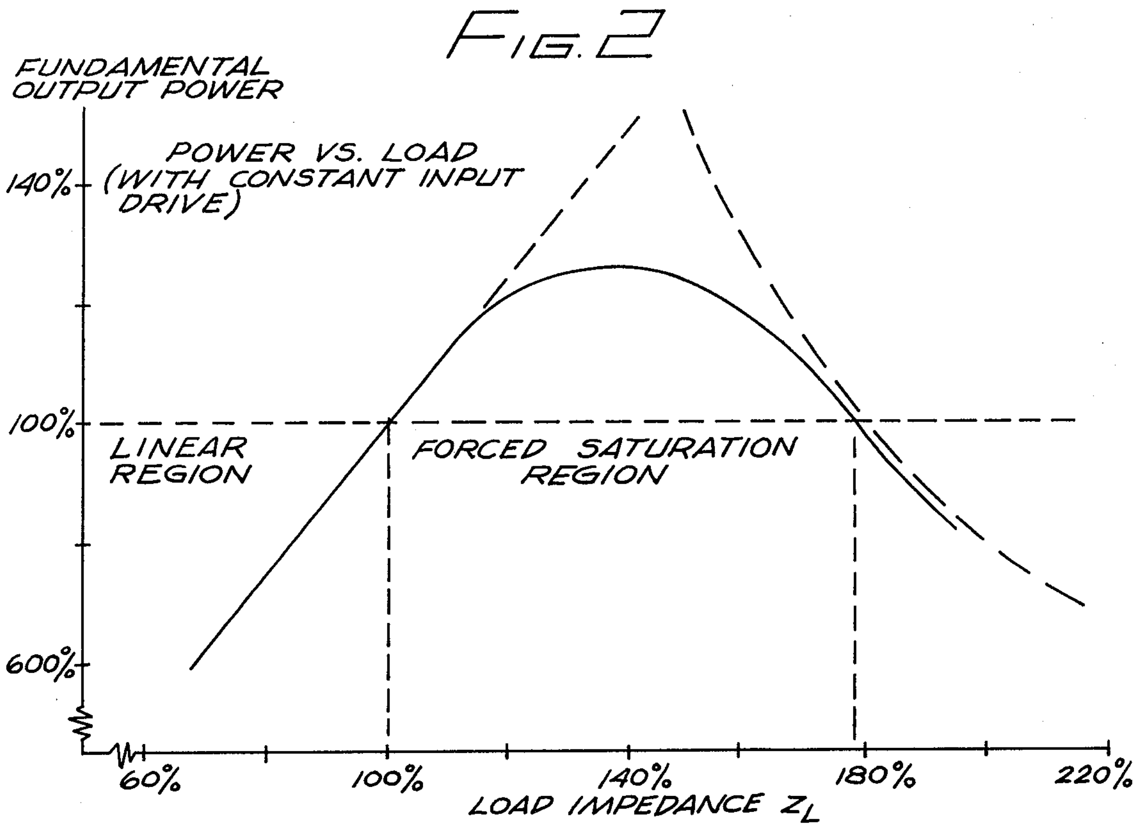
FIG. 2 is a graph showing typical output characteristics of an amplifier operative over both linear and forced saturation regions.

It is useful to consider the operation of the device of FIG. 1 with extreme variations in load impedance as shown in FIG. 2. If the input drive is maintained at a constant level and if the load impedance 18 is decreased, the output power decreases proportionately because the transistor amplifier acts as a constant current source and because the output impedance of the transistor stage is typically much higher than the load impedance (assuming common emitter configuration with current degeneration).

If it is assumed that the load impedance is increased to an extremely high value, approaching an open circuit condition, the amplifier will be operating in a limiting case, closely resembling the square wave switching operation. The amplifier will act as a constant voltage source for a given input drive, and the output power will be inversely proportional to the load impedance values.

Between the linear Class B region and the switching region, the output characteristics must pass through an inflection point of maximum power. This is the region within which the forced saturation mode amplifier is designed to operate. Within this region, the forced saturation amplifier produces up to 2.1 db higher fundamental output power than the maximum unclipped output delivered by the Class B stage. This increase in output power is achieved along with a proportionate reduction in amplifier dissipation or losses, which makes this design especially attractive. Thus a rather straightforward amplifier design may be realized which, by selectively operating in either the Class B linear mode or the forced saturation mode, has linear capability for applications such as underwater telephony, yet has high amplifier efficiency and stability for high power echo sounding operations. Because there is no need to overdrive to the extent of approaching the switching mode, there is no need for high speed switching devices, and the output is virtually free of switching transients.

Figure 3:
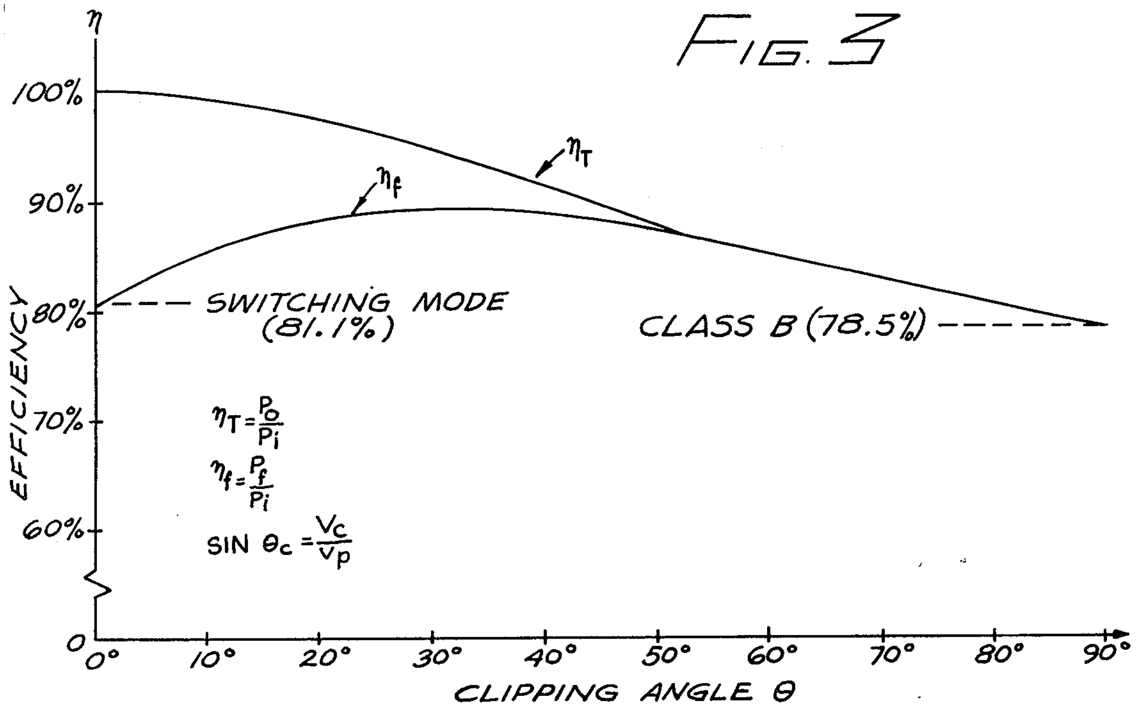
FIG. 3 is a graph showing fundamental efficiency ($\eta_f$) and total efficiency ($\eta_T$) vs. clipping angle $\theta$.

FIG. 3 is a graph showing the relationship between both total efficiency ($\eta_T$) and efficiency at the fundamental frequency ($\eta_f$) vs. clipping angle $\theta_c$. The total efficiency may be defined as the ratio of the output power $P_o$ across a resistive load to the average input d.c. power $P_i$. Fundamental efficiency is defined as the ratio of the fundamental output power $P_f$ to the average input d. c. power $P_i$.

On this graph, clipping or saturation angles near zero would be indicative of operation in a square wave or switching mode, and with 90° clipping angle the amplifier operates in the linear Class B mode. Here total efficiency near zero clipping angle approaches 100 percent, but fundamental efficiency is substantially reduced because of the harmonic frequencies generated in the switching mode. As the clipping angle increases, fundamental efficiency increases substantially and retains a high value near the peak over a range of $\theta_c$, such as between 20° and 40°. Here it can be seen that the amplifier has a fundamental efficiency of 78.5 percent in linear operation and 81.1 percent with full switching. In between these operating modes, the fundmental efficiency reaches approximately 89 percent—higher than for either the Class B linear or switching modes.

DESCRIPTION OF PREFERRED EMBODIMENTS

Figures 4, 4A:
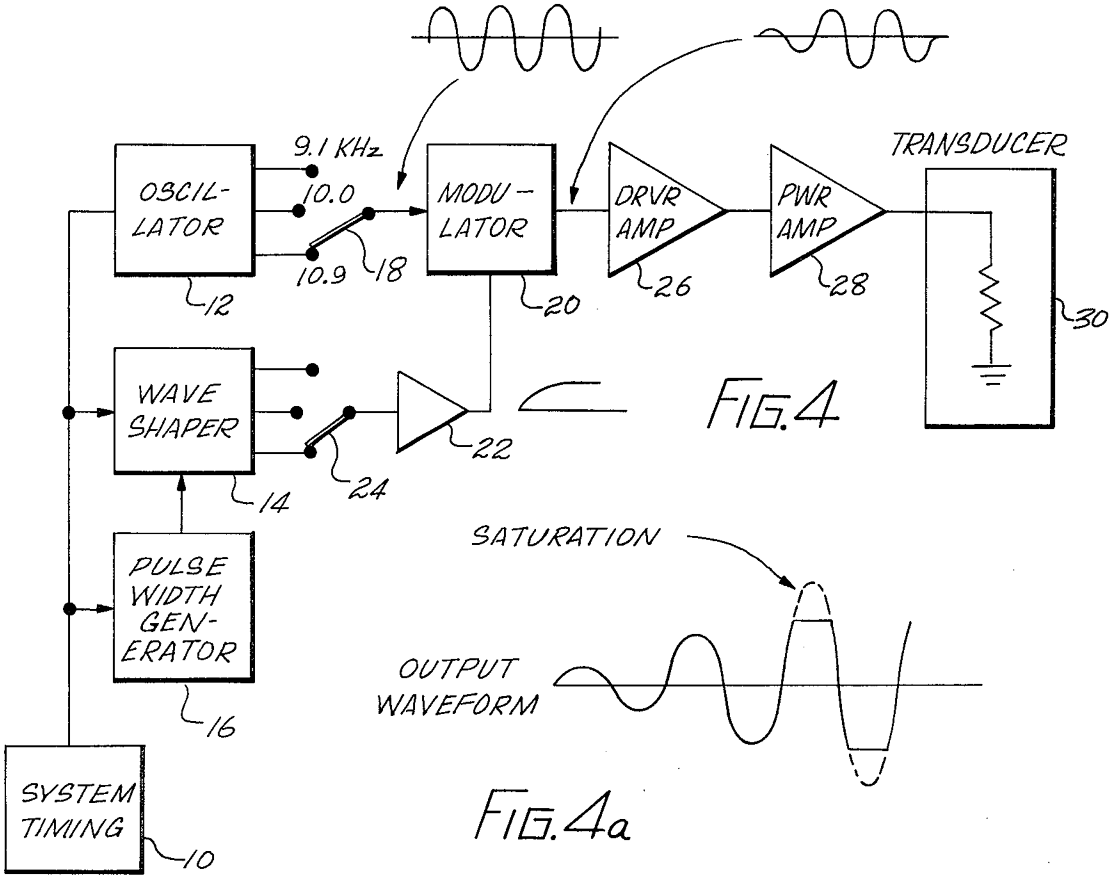
FIG. 4 is a block diagram of a typical sonar transmitter utilizing the present invention.
FIG. 4*a* is a graph showing a waveform of the output of FIG. 4.

FIG. 4 is a block diagram of a typical sonar transmitter incorporating the capability of operating in both the linear Class B and forced saturation modes. Coordinated timing signals from a timer 10, which may be a counter or a master oscillator, are supplied to a variable frequency oscillator 12, a wave shaper 14 and a pulse width generator 16. The oscillator 12 may be manually switched to select a desired carrier frequency, as by a switch 18, or this switching may be accomplished by automatic means not a part of the present invention. This output is supplied to a modulator 20 which also receives a modulating input signal from an amplifier 22 which has switch means 24 at its input for selecting one of a plurality of output signals from the wave shaper 14. Wave shaper 14 receives from the pulse width generator 16 an input signal which may be used to control the duration of each transmitted pulse of energy at the selected carrier frequency. As may be seen from the waveform diagram at the input and output terminals of modulator 20, the modulated signal from modulator 20 is supplied to a drive amplifier 26 which, in turn, drives the power amplifier 28 which supplies the signal-actuating transducer 30. The driver amplifier 26 may supply lower level signals operating the power amplifier 28 in the linear region, as shown in the first two cycles of FIG. 4*a*, or higher level signals driving amplifier 28 into the forced saturation region as exemplified by the third (clipped) cycle illustrated in FIG. 4*a*.

Figures 5, 5A, 6, 7:
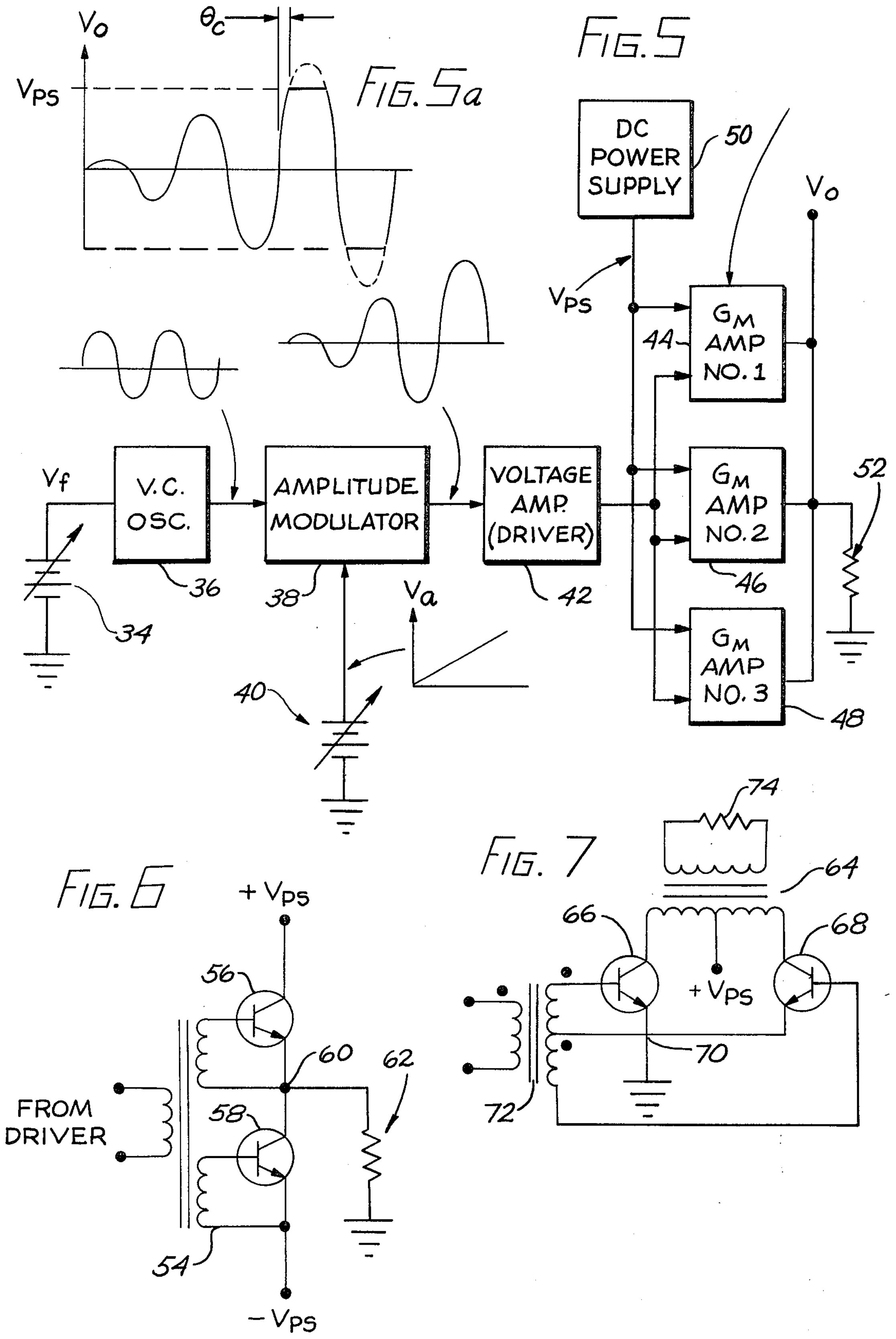
FIG. 5 is a block diagram of a transmitter arrangement showing the manner in which a plurality of similar amplifier elements may be utilized to vary the total amplifier power while using the same input stages.
FIG. 5*a* is a graph showing the output characteristics of the device of FIG. 5 including operation in both the Class B linear region and the forced saturation region.
FIG. 6 is a schematic diagram of a typical Class B transconductance amplifier utilizing the present invention.
FIG. 7 is a schematic diagram of an alternate Class B transconductance amplifier utilizing the present invention.

FIG. 5 is a block diagram of a transmitter arrangement showing the manner in which a plurality of similar amplifier elements may be utilized to vary the total amplifier power while using the same input stages. A source of variable voltage 34 is connected to a voltage-controlled oscillator 36 whose output is a sinusoidal alternating current of frequency varying with the input voltage $V_f$. This output is supplied to an amplitude modulator 38 which has an additional input from a variable control source 40 which may have the linear characteristic shown in the accompanying small graph and which would modulate the output signal from oscillator 36 as shown by the wave form at the output of amplitude modulator 38. This modulated signal is supplied as an input to a driver amplifier 42 which, in turn, provides a driving input signal to each of three transconductance ($G_M$) amplifiers 44, 46 and 58. These amplifiers are also connected to a direct current power source 50, and they operate to deliver power to a load device 52 which may also be an electroacoustic transducer. The output from amplifiers 44, 46 and 48 may be like that shown in FIG. 5*a* wherein over a portion of the driving range from O to $V_{ps}$ the output is a faithful reproduction of the input signal, but as the driver voltage increases beyond this amount the output waveform of the separate amplifiers becomes more and more clipped, this constituting operation in the forced saturation region with the amount of forced saturation being defined by the clipping angle $\theta_c$.

FIGS. 6 and 7 show alternate arrangements for typical Class B transconductance amplifier arrangements.

Each of these configurations is adaptable to the teachings of the present invention.

In FIG. 6 an input is supplied from a driver (not shown) to a transformer coupling means 54 having a secondary winding connected to the base-emitter junctions of each of a pair of transistors 56 and 58. These transistors are supplied from power sources of opposite polarity, transistor 56 being supplied from a positive power source and transistor 58 from a negative power source with the outputs of each being supplied on alternate half cycles to a common junction point 60 from whence it appears across the load device 62.

In the FIG. 7 configuration, the power source is a transformer 64 having a center tapped secondary winding, the center tap being connected to a positive source of voltage ($V_{PS}$). The collectors of each of transistors 66 and 68 are connected to opposite ends of this secondary winding. Each of the emitters of these transistors is connected to a junction point 70 which, in turn, is attached to the center tap of the secondary winding of a coupling transformer 72 whose primary winding receives the input drive signal. With the polarities as shown, it is apparent that the transistors 66 and 68 are connected to drive the load 74 on opposite half cycles of the power supply.

Figure 8:
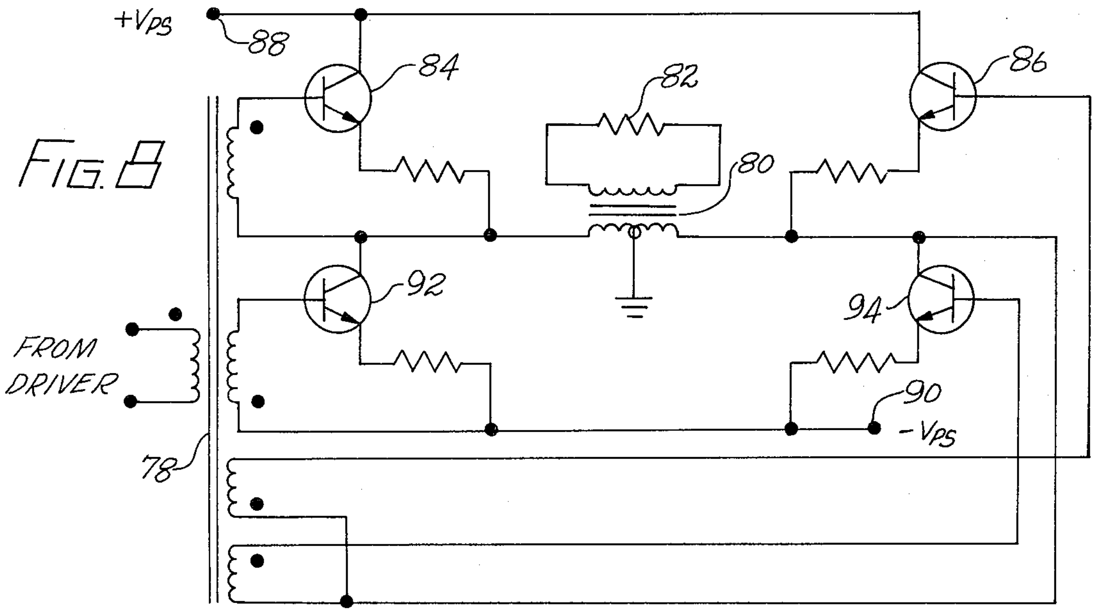
FIG. 8 is a schematic diagram of an amplifier module of the type which might be stacked according to the arrangement of FIG. 5.

In FIG. 8 appears a schematic diagram of an amplifier module of the type which might be used in the organization of FIG. 5. In this instance, the amplifier provides Class B transconductance operation in a full-bridge configuration. The input from the driver (not shown) is applied across the primary winding of an input transformer 78. An output transformer 80 whose primary winding is connected to receive the outputs from all of the transistor stages is arranged to drive a resistive load 82, which may be an electroacoustic transducer. Transistors 84 and 86 are connected to a power supply source of positive voltage at terminal 88. A terminal 90 from a negative voltage source is connected to transistors 92 and 94 with the transistors arranged as shown. During each half cycle of the power supply, diagonally arranged transistors will conduct, thereby producing a full 360° output across the primary winding of output transformer 80 and, hence, across load member 82.

In this manner the amplifier operates as a full wave device, and up to the power supply limit, the waveform across load device 82 is essentially preserved. This amplifier may, however, operate in a forced-saturated region, and the waveform appearing across load device 82 will be clipped as shown in FIG. 5*a*. Operation in either the linear or forced saturation mode is available depending upon the magnitude of the driving signal applied at the primary winding of transformer 78.

Figure 9:
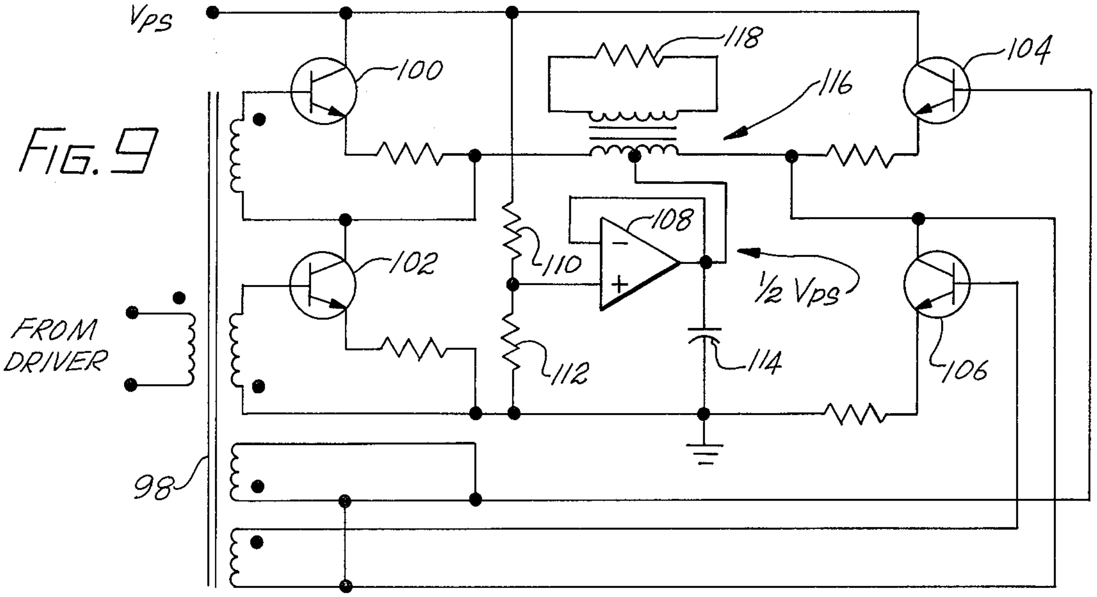
FIG. 9 is a schematic diagram of an amplifier module similar to that of FIG. 6 but operatable from a single power source and including means for compensating for power supply voltage variation.

The amplifier shown in FIG. 9 is similar to that of FIG. 8 but includes a modified power supply arrangement permitting full-wave, balanced bridge operation from a single power source $V_{PS}$. An input signal from a driver is applied across the primary winding of transformer 98 which has a plurality of secondary windings connected to the bases of transistors 100, 102, 104 and 106. In this configuration a bias regulator amplifier 108 has an input connected at the midpoint of two equal resistors 110 and 112 connected between the power source $V_{PS}$ and ground. The output is connected to ground through a capacitor 114 and to the center tap of an output transformer 116 whose secondary winding supplies output power to the load device 116. With this arrangement, the voltage level at the center tap is maintained at one-half the supply voltage $V_{PS}$.

Figure 10:
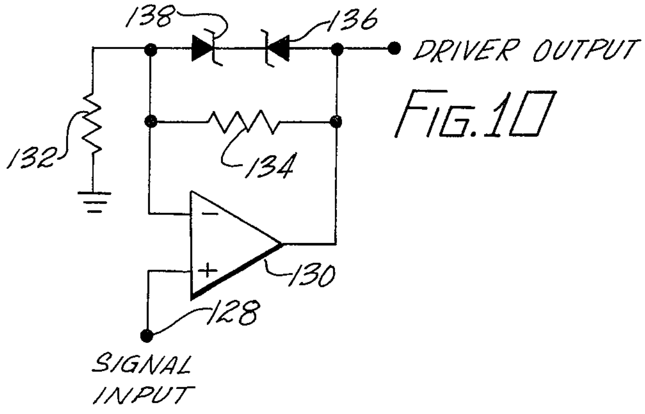
FIG. 10 is a schematic diagram showing a typical driver amplifier such as that shown in FIG. 7 including short circuit limiting means.

It may be necessary or desirable to protect the amplifier, such as that shown in FIG. 9, from damage which might occur from a short circuit at or upstream of the driver. FIG. 10 shows a driver amplifier 130 which receives an input signal at a terminal 128 and which is connected to ground through a resistor 132. Connected across the amplifier 130 are a resistor 134 and, in parallel with the resistor, a pair of oppositely poled Zener diodes 136 and 138. As will be apparent to those working in the art, the Zener diodes will operate to limit the driver amplifier output, by effectively clipping each half cycle at the Zener breakdown voltage level.

Many other amplifier configurations may be designed to use the invention taught herein, and it is to be recognized that the configurations shown are exemplary only. While the invention is basically applicable to power amplifiers wherein a premium is placed on efficient output over a very narrow band on a fundamental frequency, and it has been described in connection with a sonar transmitter application, it may also be useful in other applications such as radar. It will also be apparent that by controlling the amount or degree of forced saturation, the amplifier may operate either in a range of substantially constant power output, or a range of substantially constant voltage output with greater power variation.

I claim:

1. For use in an echo ranging sonar including a transmitting transducer whose impedance is subject to substantial variations, a power amplifier for driving said transducer with both linear output signals for underwater communication and clipped sinusoidal output signals for echo ranging at a fundamental frequency, said amplifier comprising at least one stage of amplification devices arranged in push-pull configuration, means supplying an alternating current input signal to said stage including control means selectively setting the level of said input signal such that said amplifier stage operates in the linear mode conducting over the entire output cycle to faithfully reproduce the said input signal or at a higher level such that said amplifier conducts over the entire output cycle and is controllably driven into a saturated condition at a desired angle of said input signal wherein saturation occurs over a substantial portion of the output cycle substantially less than the entire cycle.

2. A power amplifier as set forth in claim 1 wherein said driving and controlling means includes adjustment means for varying said desired angle of said input cycle.

3. A power amplifier as set forth in claim 1 wherein said control means drives said stage to a saturated condition over a porportion of said input cycle such that said amplifier produces an essentially constant power output within a narrow frequency range.

4. A power amplifier as set forth in claim 1 wherein said power amplifier is a full bridge, Class B transconductance amplifier.

5. A power amplifier as set forth in claim 1 wherein said amplifier has high output impedance relative to the input impedance of said transducer and includes a plurality of power transistors arranged as a Class B transconductance amplifier in a full bridge configuration.

6. In an echo ranging sonar including a transmitting transducer whose impedance is subject to substantial variations, a power amplifier for driving said transducer and input driving and controlling means for controlling an alternating current input signal to said amplifier, a method of controlling the input signal to said amplifier by selectively establishing a first level of input drive for underwater communication which causes said amplifier to operate in a linear mode conducting over the entire output cycle to faithfully reproduce the said input signal, or a second level of input drive for echo ranging at a fundamental frequency wherein said amplifier is caused to conduct over the entire output cycle and is controllably driven into a saturated condition at a desired angle of said input signal such that saturation occurs over a substantial portion of the output cycle substantially less than the entire cycle, whereby efficiency at the fundamental transmitted frequency is optimized in the echo ranging mode.

* * * * *